United States Patent
Omoto

(10) Patent No.: US 8,922,017 B2
(45) Date of Patent: Dec. 30, 2014

(54) SEMICONDUCTOR DEVICE

(75) Inventor: Seiichi Omoto, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 13/416,337

(22) Filed: Mar. 9, 2012

(65) Prior Publication Data

US 2013/0037876 A1 Feb. 14, 2013

(30) Foreign Application Priority Data

Aug. 10, 2011 (JP) ................................ 2011-175253

(51) Int. Cl.
*H01L 23/48* (2006.01)
*H01L 27/115* (2006.01)

(52) U.S. Cl.
CPC .... *H01L 27/11521* (2013.01); *H01L 27/11543* (2013.01)
USPC .................................. 257/751; 257/E21.584

(58) Field of Classification Search
USPC .......................................... 257/751, E21.584
See application file for complete search history.

(56) References Cited

U.S. PATENT DOCUMENTS

| | | | |
|---|---|---|---|
| 5,376,572 A * | 12/1994 | Yang et al. .................... | 438/264 |
| 5,604,140 A | 2/1997 | Byun | |
| 6,271,592 B1 | 8/2001 | Kim et al. | |
| 2007/0080429 A1* | 4/2007 | Yang et al. .................... | 257/632 |
| 2008/0083990 A1 | 4/2008 | Hatazaki et al. | |

FOREIGN PATENT DOCUMENTS

| | | |
|---|---|---|
| JP | 62-217668 | 9/1987 |
| JP | 2000-195954 | 7/2000 |
| JP | 2002-16248 | 1/2002 |
| JP | 2002-134433 | 5/2002 |
| JP | 2006-287239 | 10/2006 |
| JP | 2007-49143 | 2/2007 |
| JP | 2008-91835 | 4/2008 |
| JP | 2008-166686 | 7/2008 |
| JP | 2010-080497 | 4/2010 |
| TW | 200917494 | 4/2009 |
| TW | 200926293 | 6/2009 |
| TW | 200952173 | 12/2009 |

OTHER PUBLICATIONS

Office Action issued Jan. 13, 2014, in Taiwanese Patent Application No. 101109216 (with English-language translation).
Office Action mailed Jun. 24, 2014 in the corresponding Japanese Patent Application No. 2011-175253, filed Aug. 10, 2011 (with English-language Translation).
Office Action issued Aug. 26, 2014 in Chinese Patent Application No. 201210067195.2 (with English Translation).

* cited by examiner

*Primary Examiner* — Amar Movva
(74) *Attorney, Agent, or Firm* — Oblon, Spivak, McClelland, Maier & Neustadt, L.L.P.

(57) ABSTRACT

According to one embodiment, a semiconductor device includes a polysilicon film formed above a semiconductor substrate, and a silicide film of a metal formed on the polysilicon film. The semiconductor device of the embodiment includes an oxide film of the metal formed above the silicide film, and a film containing tungsten or molybdenum formed on the oxide film.

13 Claims, 7 Drawing Sheets

FIG.5
| METAL OXIDE FILM | GENERATION ENERGY ΔHf (kJ/mol) |
|---|---|
| $TiO_2$ | -940 |
| $ZrO_2$ | -1100.6 |
| $HfO_2$ | -1145 |
| $V_2O_3$ | -1219 |
| $Nb_2O_5$ | -1900 |
| $Ta_2O_3$ | -2046 |
| $Sc_2O_3$ | -1908.8 |
| $Y_2O_3$ | -1815 |
| $Cr_2O_3$ | -1140 |
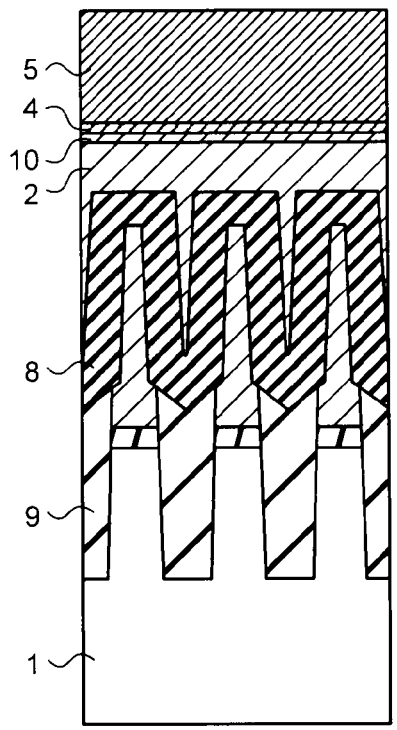
FIG.6A
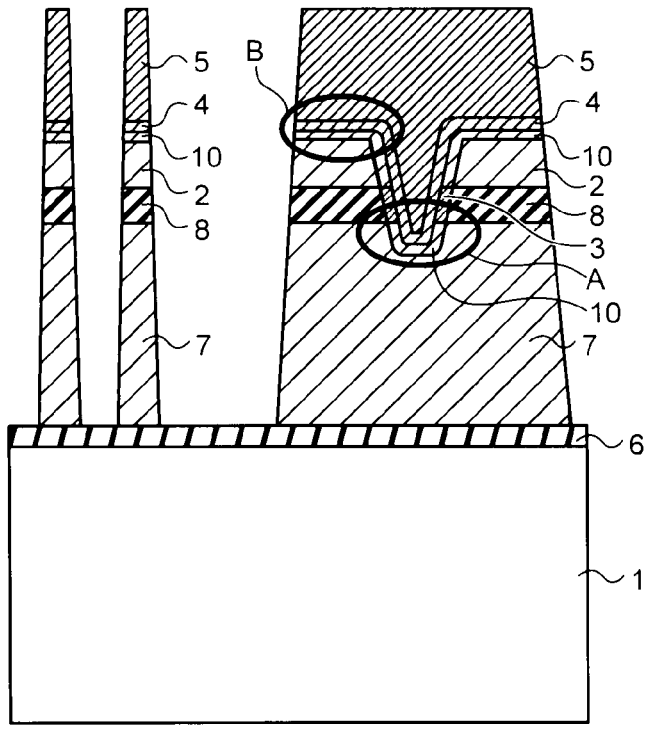
FIG.6B

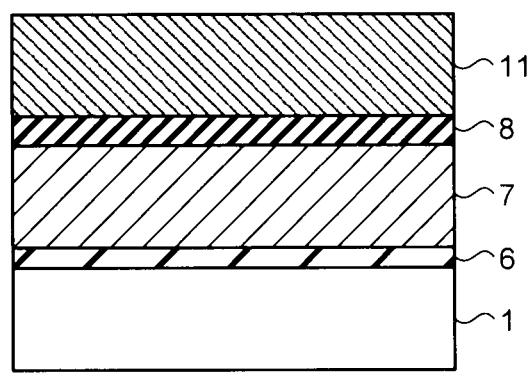
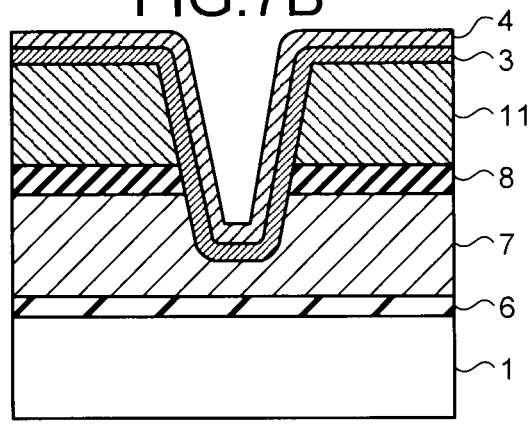

SEMICONDUCTOR DEVICE

CROSS-REFERENCE TO RELATED APPLICATIONS

This application is based upon and claims the benefit of priority from Japanese Patent Application No. 2011-175253, filed on Aug. 10, 2011; the entire contents of which are incorporated herein by reference.

FIELD

Embodiments described herein relate generally to a semiconductor device.

BACKGROUND

Conventionally, a film made of a metal such as titanium nitride or tungsten nitride is formed at a lower part of a metal to become an electrode to ensure a diffusion barrier property with polysilicon in a poly/metal gate electrode structure.

In the related art, a problem in that a resistance value of the electrode and a polysilicon/metal interface resistance become large arises.

BRIEF DESCRIPTION OF THE DRAWINGS

FIG. 5 is a diagram illustrating generation energy of each metal oxide film according to the embodiment;

FIGS. 6A and 6B are diagrams illustrating a structure of the semiconductor device according to the first and second embodiments;

FIGS. 7A and 7B are diagrams illustrating one step of a manufacturing method of a semiconductor device according to a third embodiment.

DETAILED DESCRIPTION

A semiconductor device according to one embodiment includes a polysilicon film formed above a semiconductor substrate, and a silicide film of a metal formed on the polysilicon film. The semiconductor device of the embodiment includes an oxide film of the metal formed above the silicide film, and a film containing tungsten or molybdenum formed on the oxide film.

Exemplary embodiments of the semiconductor device and the manufacturing method of the same will be explained below in detail with reference to the accompanying drawings. The present invention is not limited to the following embodiments.

(First Embodiment)

Figure 1A:
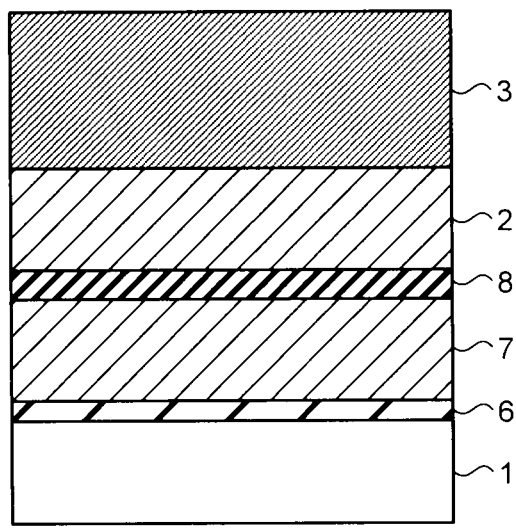
FIGS. 1A and 1B are diagrams illustrating one step of a manufacturing method of a semiconductor device according to a first embodiment.
Figure 1B:
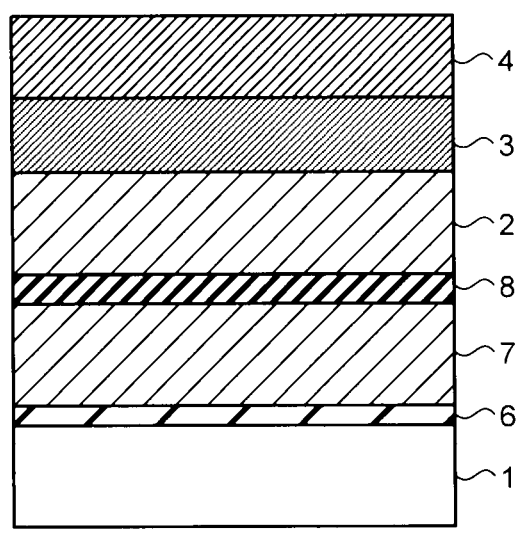

First, as illustrated in FIG. 1A, a tunnel insulating film 6, a polysilicon film (floating gate) 7, an interpoly insulating film (intermediate insulating film) 8, and a polysilicon film 2 are sequentially formed on a semiconductor substrate (silicon substrate) 1, and a titanium (Ti) film 3 is formed to be 5 nm thick using a sputtering method on a deposited polysilicon film 2 in such state. Then, the semiconductor substrate 1 is heated at a temperature of between 200 and 300° C. under an oxygen atmosphere. As a result, as illustrated in FIG. 1B, an amorphous and conductive titanium oxide ($TiO_x$) film 4 having a film thickness of greater than or equal to 3.5 nm, which is thicker than a natural oxide film, is formed on the surface of the titanium film 3. The titanium oxide film 4, which is a metal oxide film, is a film in which titanium is selected as a metal element and oxidized, where a metal element to be selected may not necessarily be limited to titanium.

In order to function as a diffusion preventing film between the silicon/electrode tungsten, the generation energy of the metal oxide film is desired to stably exist at lower than a generation energy of the oxide silicon ($SiO_2$) (−910 kJ/mol) or a generation energy of the tungsten oxide ($WO_3$) (−843 kJ/mol). As illustrated in FIG. 5, which illustrates the generation energy of each metal oxide film, an oxide such as zirconium (Zr), hafnium (Hf), vanadium (V), niobium (Nb), tantalum (Ta), scandium (Sc), yttrium (Y), and chromium (Cr) may be used other than the titanium. Therefore, the metal element containing one of such elements may be adopted.

Figure 2A:
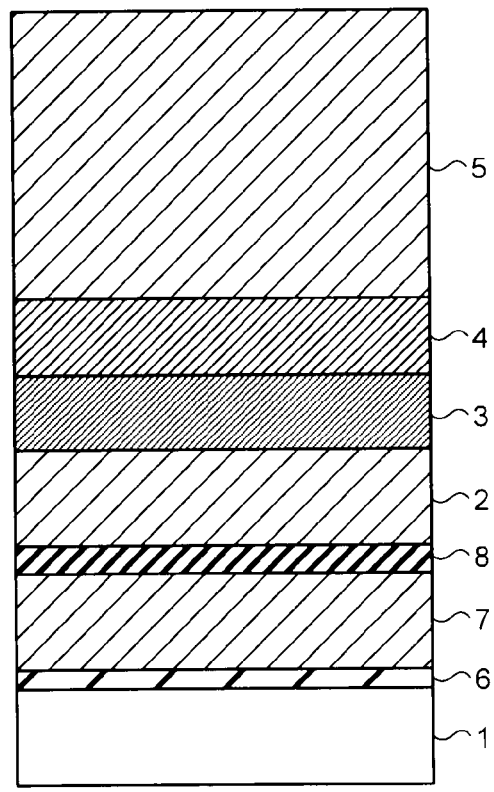
FIGS. 2A and 2B are diagrams illustrating one step of the manufacturing method of the semiconductor device according to the first embodiment.

As illustrated in FIG. 2A, the tungsten (W) film 5 to become the electrode is formed to be 50 nm in film thickness using the sputtering method or the CVD method on the titanium oxide film 4. Then, a hard mask pattern of the electrode is transferred by the photomask (not illustrated) using the exposure technique on the tungsten film 5, and the layers of the tungsten film 5 and below are processed to an electrode structure using the RIE (Reactive Ion Etching) technique to form the poly/metal gate electrode including a metal oxide film (titanium oxide film 4) serving as a barrier metal at the lower layer of the tungsten film 5 to become the electrode as illustrated in FIG. 2B.

Figure 2B:
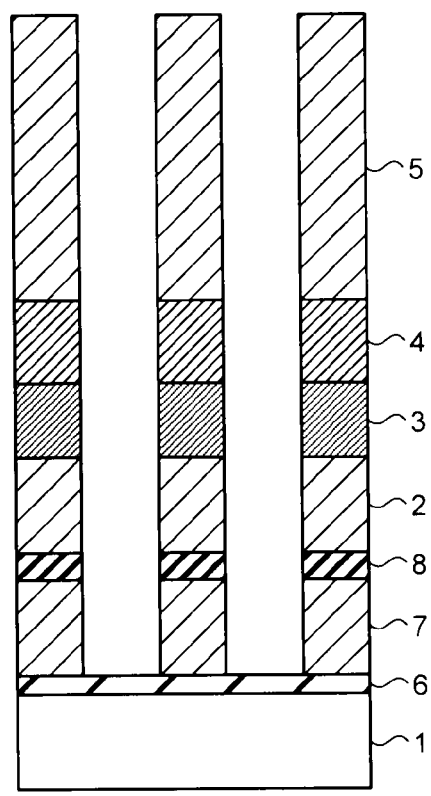
Figure 3:
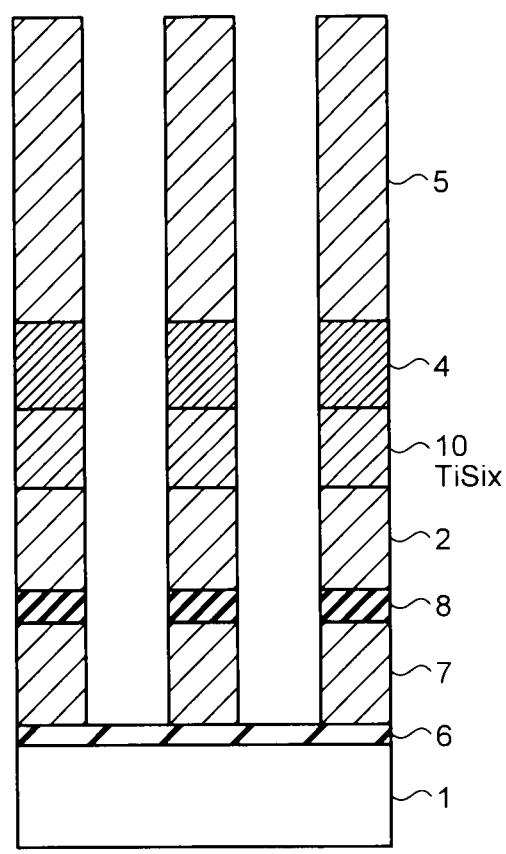
FIG. 3 is a diagram illustrating one step of the manufacturing method of the semiconductor device according to the first embodiment.

Furthermore, the RTA (Rapid Thermal Annealing) is carried out for ten seconds at 900° C., for example, in the state of FIG. 2B, so that the titanium film 3 is silicided, and a Ti silicide ($TiSi_x$) layer 10 is formed as illustrated in FIG. 3. The entire titanium film 3 is not shielded, and one part may remain as titanium. If the structure of a memory cell and a selection gate of a non-volatile semiconductor storage device is formed up to the step of FIG. 2B, the structure illustrated in FIG. 6 can be formed by the silicide step. The order of a gate shape processing and the RTA may be reversed. FIG. 6A illustrates a cross-section perpendicular to a bit line direction, and FIG. 6B illustrates a cross-section perpendicular to a word line direction. As illustrated in FIG. 6A, each structure of the bit line direction is spaced apart by an element separation layer 9. A memory cell section is illustrated on the left side of FIG. 6B, and a selection gate section is illustrated on the right side of FIG. 6B.

The poly/metal structure is formed for the electrode portion (polysilicon film 2/ Ti silicide layer 10/titanium oxide film 4/tungsten film 5) to become a control gate in the memory cell on the left side of FIG. 6B, as well as a portion A (polysilicon film 7/Ti silicide layer 10/titanium oxide film 4/tungsten film 5) and a portion B (polysilicon film 2/Ti silicide layer 10/titanium oxide film 4/tungsten film 5) in the selection gate on the right side of FIG. 6B. The structure is a stable structure in which mixing does not occur even by the following thermal step due to the stability of the generation energy of the titanium oxide film 4, so that the diffusion barrier property between the polysilicon-tungsten can be ensured and the formation of the tungsten silicide at the interface can be prevented. Furthermore, at the portion A serving as a contact forming portion where an opening that passes through the interpoly insulating film 8 is formed, the contact resistance of the polysilicon film (floating gate) 7 and the tungsten film 5 can be ensured at a low value due to the presence of the Ti silicide layer 10. On the contrary, if the tungsten nitride (WN) is formed as a barrier metal in place of the (titanium film 3/titanium oxide film 4) layer formed in the present embodiment, SiN is formed since the nitrogen in the tungsten nitride film nitrides the polysilicon in the following thermal step, and the polysilicon/metal interface resistance rises. In the present embodiment, however, lower resistance is achieved by the Ti silicide layer 10 formed by the RTA.

The specific resistance of the tungsten film 5 of 50 nm formed on the titanium oxide film 4 as in the present embodiment is 15.8 [$\mu\Omega\cdot$cm]. If the titanium nitride (TiN) or a typical titanium barrier layer is formed for the barrier metal, the crystallinity of the metal to become the electrode thereon adopts the crystallinity of the titanium nitride thus becoming a fine crystal grain, and hence the influence of the grain boundary scattering of the electrons increases and the resistance value of the electrode rises. The specific resistance of the tungsten film having a film thickness of 50 nm formed on the titanium nitride is 28.8 [$\mu\Omega\cdot$cm], and thus it is a high resistance film increased by 80% compared to the present embodiment. In other words, the poly/metal electrode becomes lower resistance by adopting the structure of the present embodiment.

It is assumed that the specific resistance of the tungsten film 5 lowers by using the structure of the present embodiment due to the difference in the crystallinity of the base. The tungsten film 5 formed on the titanium oxide film 4 is formed in a state less likely to be influenced by the base since the titanium oxide film 4 is amorphous material. Therefore, the average crystal grain diameter of the tungsten film 5 is 54.3 nm, which is greater than 21.1 nm or the average crystal grain diameter of the tungsten film formed on the titanium nitride film. As a result, the electrons flowing through the tungsten film 5 are less likely to be subjected to the influence of the grain boundary scattering, and the specific resistance of the tungsten film 5 lowers. The tungsten is used for the electrode material in the above description, but similar effects can be obtained by using molybdenum in place of the tungsten.

(Second Embodiment)

Figure 4A:
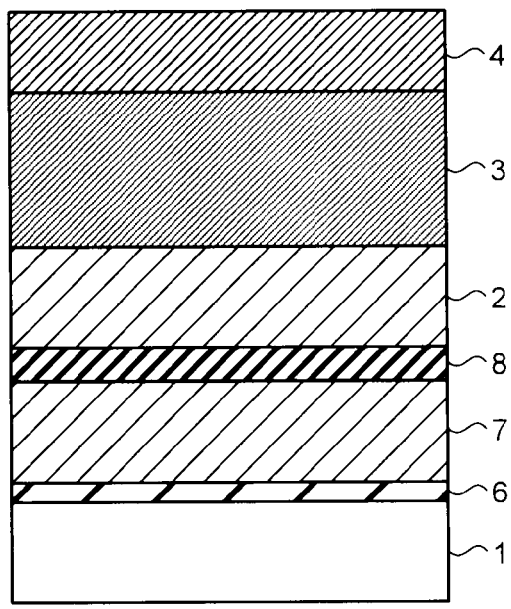
FIGS. 4A and 4B are diagrams illustrating one step of a manufacturing method of a semiconductor device according to a second embodiment.

In the present embodiment, a tunnel insulating film 6, a polysilicon film (floating gate) 7, an interpoly insulating film 8, and a polysilicon film 2 are sequentially formed on a semiconductor substrate 1, and a titanium (Ti) film 3 is formed to be 5 nm thick using a sputtering method on a deposited polysilicon film 2 in such state, similar to FIG. 1A. Thereafter, as illustrated in FIG. 4A, an oxidation gas containing oxygen atoms such as oxygen, ozone, and water is introduced into a sputtering chamber, and the titanium oxide film 4, which is a metal oxide film, is formed to have a film thickness of greater than or equal to 3.5 nm thicker than the natural oxide film using a reactive sputtering method. The oxygen concentration in the film may be freely changed along the perpendicular direction with respect to the substrate surface of the semiconductor substrate 1, thereby forming a structure of FIG. 4A, for example, by forming a stacked structure of the metal film/metal oxide film by introducing the oxidation gas from the middle of the sputter film formation of titanium as illustrated in FIG. 1A.

Figure 4B:
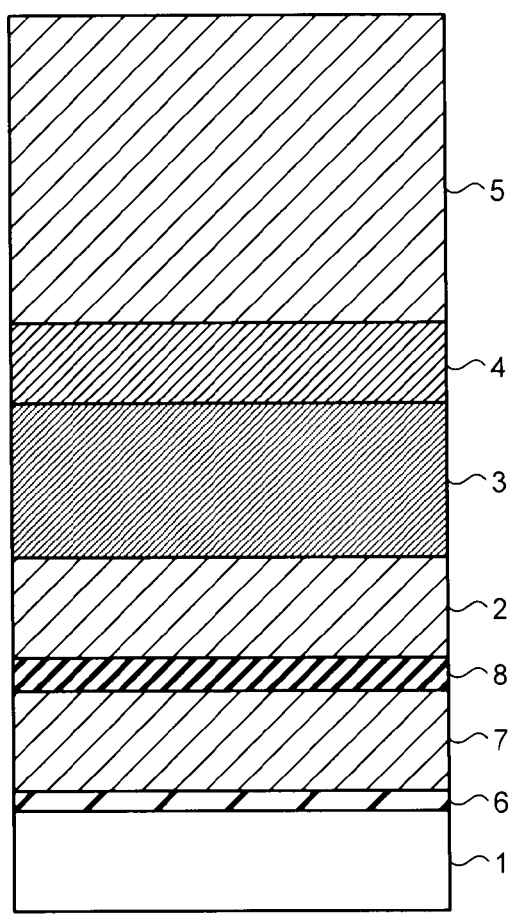

Subsequently, a tungsten (W) film 5 to become an electrode is formed using a sputtering method or a CVD method on the titanium oxide film 4, as illustrated in FIG. 4B. The subsequent steps are similar to those illustrated in FIGS. 2B and 3, and a poly/metal electrode structure illustrated in FIG. 6 having a structure similar to the first embodiment can be formed. In the present embodiment as well, molybdenum may be used an place of the tungsten for the electrode material.

(Third Embodiment)

In the present embodiment, a tunnel insulating film 6, a polysilicon film (floating gate) 7, and an interpoly insulating film 8 are sequentially formed on a semiconductor substrate 1, and a TiN film 11 is formed thereon. Thereafter, an opening of a contact forming portion of the selection gate is formed, and a titanium film 3 and a titanium oxide film 4 are conformally formed in the opening through a method similar to the first or second embodiment (FIG. 7B). Thereafter, a tungsten film 5 is formed, and for example, the RTA of ten seconds at 90° C. and RIE for processing of the gate shape are carried out to form a structure illustrated in FIG. 8. In FIG. 8, the site having the same reference numerals as FIG. 6 indicates the same configuration. In the present embodiment, the titanium film 3 brought into contact with the polysilicon film 7 is silicided in FIG. 7B by the RTA, and a Ti silicide (TiSi$_x$) layer 10 is formed as illustrated in FIG. 8B. In this case, not all the titanium film 3 brought into contact with the polysilicon film 7 is silicided, and one part may remain as titanium. The order of the processing of the gate shape and the RTA may be reversed.

Figure 8A:
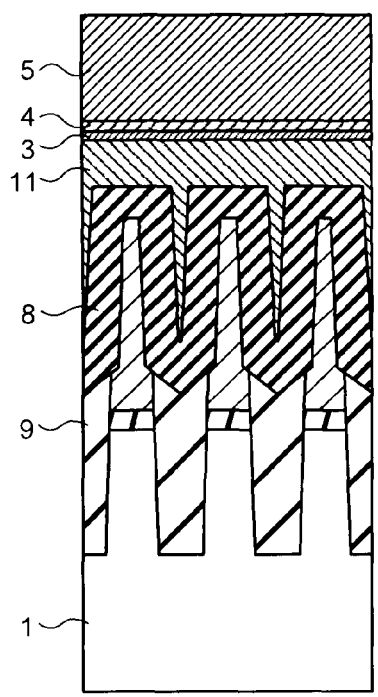
FIGS. 8A and 8B are diagrams illustrating a structure of the semiconductor device according to the third embodiment.
Figure 8B:
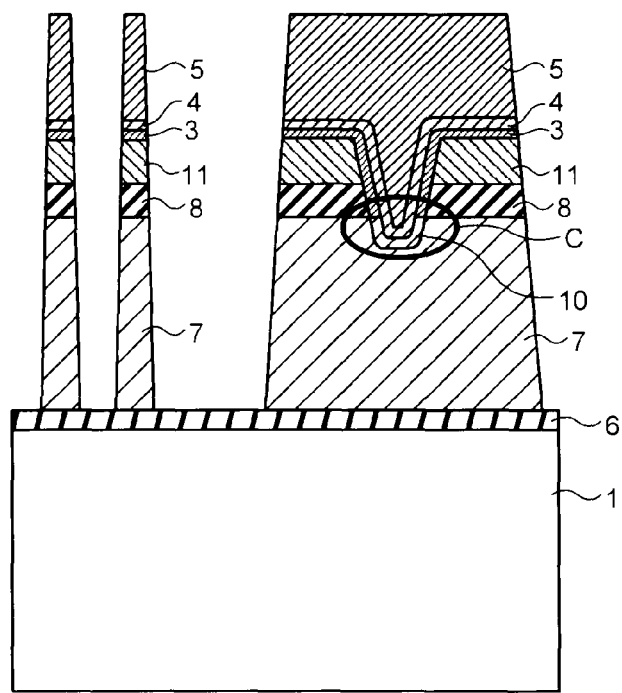

FIG. 8A illustrates a cross-section perpendicular to the bit line direction, and FIG. 8B illustrates a cross-section perpendicular to the word line direction. The memory cell section is illustrated on the left side of FIG. 8B, and the selection gate section is illustrated on the right side. In the present embodiment, the poly/metal structure is formed for a portion C (polysilicon film 7/Ti silicide layer 10/titanium oxide film 4/tungsten film 5) in the selection gate on the right side of FIG. 8. The other stacked portion (TiN film 11/titanium film 3/titanium oxide film 4/tungsten film 5) is a so-called metal/metal gate electrode structure.

In the present embodiment as well, the portion C is a structure having heat stability with a diffusion barrier property, and the contact resistance can be ensured at a low value. In the portion of the metal/metal gate electrode structure, lower resistance can be achieved by the reduction effect of the specific resistance of the tungsten film 5. In the present embodiment as well, molybdenum may be used in place of the tungsten for the electrode material.

As described above, the poly/metal gate electrode structure having a barrier film in which the diffusion preventing property and the heat stability are achieved between the polysilicon/electrode tungsten (or molybdenum) and the metal/metal gate electrode structure can be formed. In the embodiments described above, the poly/metal gate electrode and the metal/metal gate electrode have been described by way of example, but it should be recognized that the structure of the above described embodiments may be applied to areas other than the gate electrode.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising a structure in which,
a tunnel insulating film, a polysilicon floating gate film, and an intermediate insulating film are sequentially formed on a semiconductor substrate, an opening passing through to the polysilicon floating gate film being provided at one part of the intermediate insulating film, and
a silicide film of a metal, an oxide film of the metal, and a film containing tungsten or molybdenum are sequentially formed on the polysilicon floating gate film in the opening.

2. The semiconductor device according to claim 1, wherein a generation energy of the oxide film of the metal is smaller than a generation energy of an oxide film of silicon and a generation energy of an oxide film of tungsten or molybdenum.

3. The semiconductor device according to claim 1, wherein the metal includes at least one element of titanium, zirconium, hafnium, vanadium, niobium, tantalum, scandium, yttrium, and chromium.

4. The semiconductor device according to claim 1, wherein the oxide film is amorphous material.

5. The semiconductor device according to claim 1, wherein a film of the metal is formed between the silicide film and the oxide film.

6. The semiconductor device according to claim 1, wherein the structure forms a selection gate section of a non-volatile semiconductor storage device.

7. A semiconductor device comprising a structure in which,
a tunnel insulating film, a polysilicon floating gate film, an intermediate insulating film, and a polysilicon electrode film are sequentially formed on a semiconductor substrate, an opening passing through to the polysilicon floating gate film being provided at one part of the polysilicon electrode film and the intermediate insulating film, and
a silicide film of a metal, an oxide film of the metal, and a film containing tungsten or molybdenum are sequentially formed on the polysilicon floating gate film in the opening and the polysilicon electrode film in a portion other than the opening.

8. The semiconductor device according to claim 7, wherein a generation energy of the oxide film of the metal is smaller than a generation energy of an oxide film of silicon and a generation energy of an oxide film of tungsten or molybdenum.

9. The semiconductor device according to claim 7, wherein the metal includes at least one element of titanium, zirconium, hafnium, vanadium, niobium, tantalum, scandium, yttrium, and chromium.

10. The semiconductor device according to claim 7, wherein the oxide film is amorphous material.

11. The semiconductor device according to claim 7, wherein a film of the metal is formed between the silicide film and the oxide film.

12. The semiconductor device according to claim 7, wherein the structure forms a selection gate section of a non-volatile semiconductor storage device.

13. The semiconductor device according to claim 12, wherein a memory cell section of the non-volatile semiconductor storage device includes a structure in which the tunnel insulating film, the polysilicon floating gate film, the intermediate insulating film, the polysilicon electrode film, the silicide film, the oxide film, the film containing tungsten or molybdenum are sequentially formed on the semiconductor substrate.

* * * * *